US012628500B2

(12) United States Patent
Kim et al.

(10) Patent No.: US 12,628,500 B2
(45) Date of Patent: May 12, 2026

(54) ORGANIC LIGHT EMITTING DISPLAY PANEL AND ORGANIC LIGHT EMITTING DISPLAY DEVICE

(71) Applicant: LG Display Co., Ltd., Seoul (KR)

(72) Inventors: Wonrae Kim, Paju-si (KR); SeongHan Hwang, Goyang-si (KR); JuHyuk Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 655 days.

(21) Appl. No.: 17/988,596

(22) Filed: Nov. 16, 2022

(65) Prior Publication Data

US 2023/0217725 A1 Jul. 6, 2023

(30) Foreign Application Priority Data

Dec. 31, 2021 (KR) ......................... 10-2021-0194686

(51) Int. Cl.
*H10K 59/122* (2023.01)

(52) U.S. Cl.
CPC .................................. *H10K 59/122* (2023.02)

(58) Field of Classification Search
CPC ........... H10K 59/122; H10K 59/80517; H10K 59/8792; H10K 50/805; H10K 50/844
See application file for complete search history.

(56) References Cited

U.S. PATENT DOCUMENTS

2018/0033841 A1* 2/2018 Yang ..................... H10K 59/873
2021/0210515 A1* 7/2021 Zhang .................. H10K 50/844

FOREIGN PATENT DOCUMENTS

KR 10-2016-0094493 A 8/2016
KR 10-2020-0119946 A 10/2020
KR 20200119946 A * 10/2020 ........... H10K 50/805

OTHER PUBLICATIONS

English Machine Translation of Choi et al KR20200119946 (Year: 2025).*

* cited by examiner

*Primary Examiner* — Donald L Raleigh
(74) *Attorney, Agent, or Firm* — Birch, Stewart, Kolasch & Birch, LLP

(57) ABSTRACT

An organic light emitting display panel and an organic light emitting display device including the panel are discussed. The organic light emitting display device can include a planarization layer disposed on a substrate, a first electrode disposed on a portion of an upper surface of the planarization layer, a protective pattern surrounding a portion of an upper surface and a side surface of the first electrode, a bank disposed to expose the portion of the upper surface of the first electrode and to be in contact with the portion of the upper surface of the planarization layer while surrounding the protective pattern, a light emitting layer disposed on the bank and disposed on the upper surface of the first electrode that does not overlap the bank, and a second electrode disposed on the light emitting layer. The display device is capable of preventing the first electrode from being contaminated by foreign substances.

18 Claims, 18 Drawing Sheets

311a  311b  311c          209

311

511a  511b  511c   209

211

511a  511b  511c   209

211

Exposure

511a 511b 511c   209 450

211

Development

511a 511b 511c   209 250

211

Stripper

511a 511b 511c    209 450

211

Rinse

660

511a 511b 511c    209 250

211

511a  511b  511c  209  1550  1560

211

260

Contamination shielding properties depending on thickness of protective pattern

Change of self-outgassing depending on thickness of protective pattern

| Minimum thickness | 700 nm (Average thickness of first electrode) |
|---|---|
| Optimum thickness | 1.6~1.8 μm |

ORGANIC LIGHT EMITTING DISPLAY PANEL AND ORGANIC LIGHT EMITTING DISPLAY DEVICE

CROSS-REFERENCE TO RELATED APPLICATION

This application claims priority under 35 U.S.C. § 119(a) to Korean Patent Application No. 10-2021-0194686, filed in the Republic of Korea on Dec. 31, 2021, the entire contents of which are hereby expressly incorporated by reference into the present application.

BACKGROUND OF THE DISCLOSURE

Technical Field

Embodiments of the disclosure relate to an organic light emitting display panel and an organic light emitting display device including the organic light emitting display panel.

Description of the Related Art

A display device is an output device for presentation of information in visual and plays a key role in the information age. Display devices are evolving to deliver a higher performance while being slimmer, lighter, and portable.

Among flat panel displays which are much lighter and less bulky than cathode-ray tubes (CRTs), an organic light emitting display (OLED) device gains popularity that displays images by controlling the amount of light emitted by a light emitting layer.

In the process of manufacturing the organic light emitting display (OLED) device, contamination sources such as foreign substances can be generated, which may cause issues in an organic light emitting element.

BRIEF SUMMARY OF THE DISCLOSURE

Embodiments of the disclosure relate to an organic light emitting display panel having improved reliability by preventing foreign substances from existing on the electrodes of an organic light emitting element, and to an organic light emitting display device including such display panel.

Embodiments of the disclosure relate to the organic light emitting display panel having the organic light emitting element where an angle between a side surface and a horizontal surface of a bank is easily adjusted to make the thickness of an organic layer constant, thereby improving luminous efficiency, and relate to the organic light emitting display device having such display panel.

According to embodiments of the disclosure, there can be provided an organic light emitting display device, including a planarization layer disposed on a substrate, a first electrode disposed on a portion of an upper surface of the planarization layer, a protective pattern disposed on a portion of an upper surface of the first electrode, a bank disposed to expose the portion of the upper surface of the first electrode and to be in contact with the portion of the upper surface of the planarization layer while surrounding the protective pattern, a light emitting layer disposed on the bank and disposed on the upper surface of the first electrode that does not overlap the bank, and a second electrode disposed on the light emitting layer.

According to embodiments of the disclosure, there can be provided an organic light emitting display panel, including a substrate comprising an emission area and a non-emission area adjacent to the emission area, a planarization layer disposed on the substrate, a first electrode disposed on a portion of an upper surface of the planarization layer, a protective pattern surrounding a portion of an upper surface and a side surface of the first electrode and disposed in the non-emission area, a bank disposed to expose the portion of the upper surface of the first electrode and to be in contact with the portion of the upper surface of the planarization layer while surrounding the protective pattern, a light emitting layer disposed on the bank and disposed on the upper surface of the first electrode that does not overlap the bank, and a second electrode disposed on the light emitting layer.

According to embodiments of the disclosure, there can be provided the organic light emitting display panel having improved reliability without the foreign substances existing on the electrodes of the organic light emitting element, and the organic light emitting display device having such display penal.

According to embodiments of the disclosure, there can be provided the organic light emitting display panel having the organic light emitting element where the angle between the side surface and the horizontal surface of the bank can be easily adjusted to make the thickness of the organic layer constant, thereby improving luminous efficiency, and the organic light emitting display device having such display panel.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
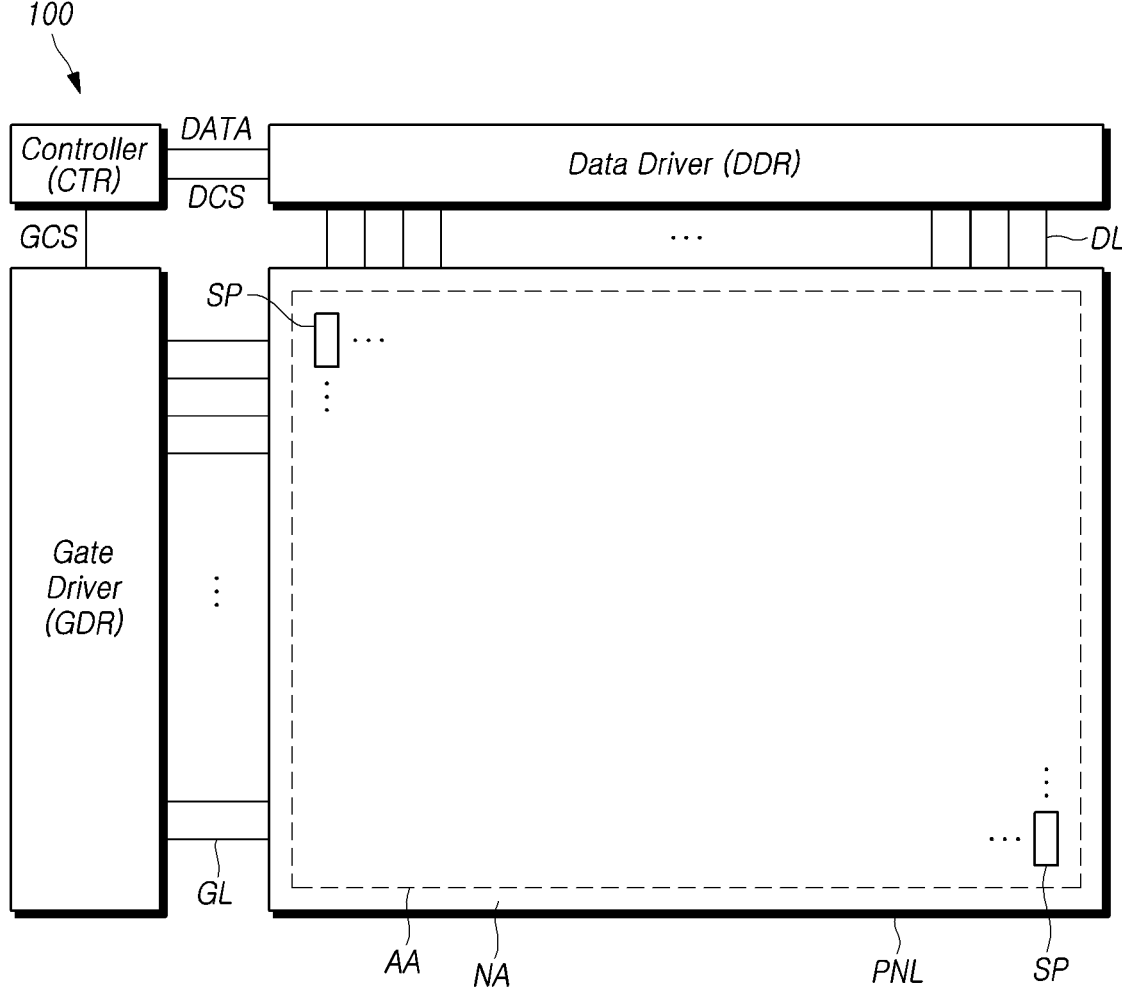
FIG. 1 is a view schematically illustrating a system configuration of an organic light emitting display device according to embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present invention rather unclear.

Terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms such as "first," "second," "A," "B," "(A)," or "(B)" can be used herein to describe elements of the present disclosure. Each of these terms is not used to define essence, order, sequence, or the number of elements, etc., but is used merely to distinguish the corresponding element from other elements.

When it is mentioned that a first element "is connected or coupled to," "contacts or overlaps," etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element can be included in at least one of two or more elements that "are connected or coupled to," "contact or overlap," etc. each other.

When time-related terms, such as "after," "subsequent to," "next," "before," and the like, are used to describe processes or operations of elements or configurations, or flows or steps in operations, processes, manufacturing methods, these terms can be used to describe non-consecutive or non-sequential processes or operations unless the term "directly" or "immediately" is used together.

In addition, when any dimensions, relative sizes, etc. are mentioned, it should be considered that numerical values for elements or features, or corresponding information (e.g., level, range, etc.) include a tolerance or error range that can be caused by various factors (e.g., process factors, internal or external impact, noise, etc.) even when a related description is not specified. Further, the term "may" fully encompasses all the meanings of the term "can."

Hereinafter, various embodiments of the present disclosure will be described in detail with reference to the accompanying drawings. All the components of each organic light emitting display device according to all embodiments of the present disclosure are operatively coupled and configured.

FIG. 1 is a view schematically illustrating a system configuration of an organic light emitting display device according to embodiments of the disclosure.

Referring to FIG. 1, a organic light emitting display device 100 according to embodiments of the disclosure can be a lighting device, a light emitting device, and the like. Hereinafter, for convenience of description, the organic light emitting display device 100 will be mainly described. However, so long as a transistor(s) is included, the same can be applied to other various organic light emitting display devices 100 such as a lighting device and a light emitting device, as well as the organic light emitting display device 100.

The organic light emitting display device 100 according to embodiments of the disclosure can include a display panel PNL for displaying an image or outputting light, and a driving circuit for driving the display panel PNL.

Furthermore, the organic light emitting display device 100 according to embodiments of the disclosure can be a bottom emission type of organic light emitting display device in which light is emitted in a direction toward a substrate on which a light emitting element is disposed, although not limited thereto. In some cases, the organic light emitting display device 100 of the disclosure can be of a top emission type in which light is emitted to a surface opposite to the substrate on which the light emitting element is disposed, or of a double-sided emission type in which light emitted from the light emitting element is emitted in the direction toward the substrate and to the surface opposite to the substrate.

A plurality of data lines DL and a plurality of gate lines GL can be disposed on the display panel PNL. In addition, in the display panel PNL, a plurality of sub-pixels SP defined by the plurality of data lines DL and the plurality of gate lines GL can be arranged in a matrix type.

In the display panel PNL, the plurality of data lines DL and the plurality of gate lines GL can be disposed to cross each other. For example, the plurality of gate lines GL can be arranged in rows or columns, and the plurality of data lines DL can be arranged in columns or rows. Hereinafter, for convenience of description, it is assumed that the plurality of gate lines GL are arranged in rows and the plurality of data lines DL are arranged in columns.

In addition to the plurality of data lines DL and the plurality of gate lines GL, other types of signal lines can be arranged in the display panel PNL depending on a sub-pixel structure, etc. A driving power line, a reference power line, or a common power line, etc. can be further arranged in the display panel PNL.

The type of signal lines arranged in the display panel PNL can vary depending on the sub-pixel structure, etc. In addition, throughout this specification, the signal lines can be of a concept containing electrodes to which a signal is applied.

The display panel PNL can include an active area AA on which an image (e.g., picture) is displayed and a non-active area NA, outside the active area, on which no image is displayed. Here, the non-active area NA can also be referred to as a bezel area.

The plurality of sub-pixels SP for displaying an image can be disposed in the active area AA.

In the non-active area NA can be disposed a pad portion for electrically connecting a data driver DDR, and a plurality of data link lines can disposed in the non-active area NA to connect the pad portion and the plurality of data lines DL. Here, the plurality of data link lines can be portions in which the plurality of data lines DL extend to the non-active area NA or separate patterns electrically connected to the plurality of data lines DL.

Furthermore, in the non-active area NA can be disposed gate driving-related wirings for transmitting a voltage (signal) necessary for gate driving to a gate driver GDR through the pad portion to which the data driver DDR is electrically connected. For example, the gate driving-related wirings can include clock wirings for transmitting a clock signal, gate power lines that transmit gate voltages (VGH, VGL), gate driving control signal wirings for transmitting various control signals necessary to generate a scan signal, etc. These gate driving-related wirings can be disposed in the non-active area NA, unlike the gate lines GL disposed in the active area AA.

The driving circuit can include the data driver DDR for driving the plurality of data lines DL, the gate driver GDR for driving the plurality of gate lines GL, a controller CTR for controlling the data driver DDR and the gate driver GDR, and so on.

The data driver DDR can serve to drive the plurality of data lines DL by outputting a data voltage to the plurality of data lines DL.

The gate driver GDR can serve to drive the plurality of gate lines GL by outputting a scan signal to the plurality of gate lines GL.

The controller CTR can supply various control signals (e.g., DCS and GCS) used for driving operations of the data driver DDR and the gate driver GDR to control the driving operations of the data driver DDR and the gate driver GDR. In addition, the controller CTR can supply an image data DATA to the data driver DDR.

The controller CTR can operate to start scanning according to the timing implemented in each frame. The controller CTR can convert the image data input from the outside complying to a data signal format used by the data driver (DDR) to output the converted image data DATA, and control the data driving at an appropriate timing point in compliance with the scanning.

In order to control the data driver DDR and the gate driver GDR, the controller CTR can receive timing signals such as a vertical synchronization signal Vsync, a horizontal synchronization signal Hsync, an input data enable (DE) signal, a clock signal CLK from an external device (e.g., a host system) to generate various control signals to be output to the data driver DDR and the gate driver GDR.

For example, in order to control the gate driver GDR, the controller CTR can output various gate control signals GCS including a gate start pulse (GSP), a gate shift clock (GSC), a gate output enable signal (GOE), and the like.

Furthermore, in order to control the data driver DDR, the controller CTR can output various data control signals DCS including a source start pulse (SSP), a source sampling clock (SSC), a source output enable signal (SOE), and so on.

The controller CTR can be a timing controller used in a conventional display technology or a controller capable of further performing other control functions including the timing controller.

The controller CTR can be implemented as a separate component from the data driver DDR, or can be implemented as an integrated circuit with the data driver DDR.

The data driver DDR can receive the image data DATA from the controller CTR and supply a data voltage to the plurality of data lines DL to drive the plurality of data lines DL. Here, the data driver DDR can be also referred to as a source driver.

The data driver (DDR) can exchange various signals with the controller CTR through various interfaces.

The gate driver GDR can sequentially supply scan signals to the plurality of gate lines GL to drive the plurality of gate lines GL in sequence. Here, the gate driver GDR can be also referred to as a scan driver.

The gate driver GDR can sequentially supply a scan signal of an on/off voltage to the plurality of gate lines GL under the control of the controller CTR.

When a specific gate line is opened by the gate driver GDR, the data driver DDR can convert the image data DATA received from the controller CTR into an analog data voltage to be supplied to the plurality of data lines DL.

The data driver DDR can be located on only one side (e.g., either a top or bottom side) of the display panel PNL, but the disclosure is not limited thereto. For example, it can be located on both sides (e.g., both top and bottom sides) of the display panel PNL, according to a driving method, a display panel design method, etc.

The gate driver GDR can be located on only one side (e.g., either a left or right side) of the display panel PNL, but the disclosure is not limited thereto. For example, it can be located on both sides (e.g., both left and right sides) of the display panel PNL, according to a driving method, a display panel design method, etc.

The data driver DDR can be implemented with at least one source driver integrated circuit SDIC.

Each source driver integrated circuit SDIC can include a shift register, a latch circuit, a digital-to-analog converter (DAC), an output buffer, and the like. In some cases, the data driver DDR can further include at least one analog-to-digital converter (ADC).

Each source driver integrated circuit SDIC can be connected to a bonding pad of the display panel PNL in either a tape automated bonding (TAB) type or a chip-on-glass (COG) type, or can be placed directly onto the display panel PNL. In some cases, each source driver integrated circuit SDIC can be integrated with the display panel PNL and disposed therein. Furthermore, each source driver integrated circuit SDIC can be implemented in a chip-on-film (COF) type. In this case, each source driver integrated circuit SDIC can be mounted on a circuit film to be electrically connected to the data lines DL of the display panel PNL through the circuit film.

The gate driver GDR can include a plurality of gate driving circuits GDC. Here, the plurality of gate driving circuits GDC can respectively correspond to the plurality of gate lines GL.

Each gate driving circuit GDC can include a shift register, a level shifter, and the like.

Each gate driving circuit GDC can be connected to the bonding pad of the display panel PNL in either a tape automated bonding (TAB) type or a chip-on-glass (COG) type. In addition, each gate driving circuit GDC can be implemented in a chip-on-film (COF) type. In this case, each gate driving circuit GDC can be mounted on a circuit film to be electrically connected to the gate lines GL of the display panel PNL through the circuit film. Furthermore, each gate driving circuit GDC can be implemented in a gate-in-panel (GIP) type to be embedded in the display panel PNL. For example, each gate driving circuit GDC can be formed directly in the display panel PNL.

Figure 2:
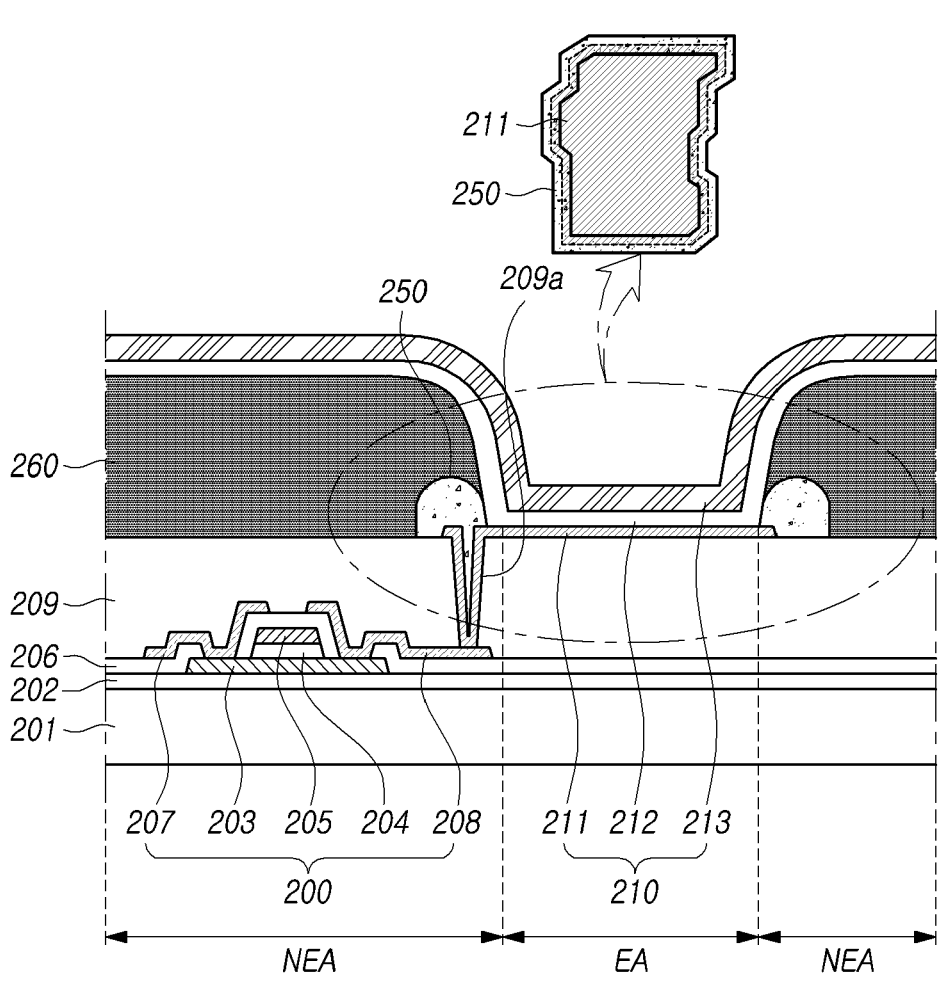
FIG. 2 is a cross-sectional view schematically illustrating a structure of one sub-pixel area of the organic light emitting display device according to embodiments of the disclosure.

FIG. 2 is a cross-sectional view schematically illustrating a structure of one sub-pixel area of the organic light emitting display device according to embodiments of the disclosure. Each sub-pixel of FIG. 1 can have the configuration of the sub-pixel of FIG. 2.

Referring to FIG. 2, the organic light emitting display device 100 according to embodiments of the disclosure can include at least one thin film transistor 200 disposed on a substrate 201 and an organic light emitting element 210 disposed on the thin film transistor 200.

The thin film transistor 200 can include an active layer 203, a gate electrode 205, a source electrode 207, and a drain electrode 208.

The organic light emitting element 210 can include a first electrode 211, a light emitting layer 212, and a second electrode 213.

Specifically, a buffer layer 202 can be disposed on the substrate 201. The buffer layer 202 can include an inorganic insulating material such as silicon oxide (SiOx), silicon nitride (SiNx), or silicon oxynitride (SiON), but the embodiment of the disclosure is not limited thereto.

In FIG. 2, the buffer layer 202 has a single-layer structure, but it can have a multi-layer structure.

When the buffer layer 202 has a multi-layer structure, layers including at least two inorganic insulating materials among the inorganic materials such as silicon oxide (SiOx), silicon nitride (SiNx), or silicon oxynitride (SiON) can be alternately disposed, but embodiments of the disclosure is not limited thereto.

In the following description, for convenience, a structure in which the buffer layer 202 is a single layer is described.

The active layer 203 of the thin film transistor 200 can be disposed on the buffer layer 202.

The active layer 203 can be various types of semiconductor layers. For example, the active layer 203 can be any one of an oxide semiconductor, an amorphous silicon semiconductor, and a polysilicon semiconductor, but embodiments of the disclosure are not limited thereto.

A gate insulation film 204 can be disposed on the active layer 203. The gate insulation film 204 can include the inorganic insulating material such as silicon oxide (SiOx), silicon nitride (SiNx), or silicon oxynitride (SiON), but of the embodiment of the disclosure is not limited thereto.

FIG. 2 illustrates a structure in which the gate insulation film 204 is disposed on a portion of an upper surface of the active layer 203, but embodiments of the disclosure are not limited thereto. For example, the gate insulation film 204 can be disposed covering the active layer 203.

The gate electrode 205 of the thin film transistor 200 can be disposed on the gate insulation film 204. The gate electrode 205 can include any one of metals such as aluminum (Al), gold (Au), silver (Ag), copper (Cu), tungsten (W), molybdenum (Mo), chromium (Cr), tantalum (Ta), and titanium (Ti) or alloys thereof, but the disclosure is not limited thereto.

An inter-layer insulation film 206 can be disposed on the gate electrode 205. The inter-layer insulation film 206 can include the inorganic insulating material, such as silicon oxide (SiOx), silicon nitride (SiNx), or silicon oxynitride (SiON), but the disclosure is not limited thereto.

The source electrode 207 and the drain electrode 208 of the thin film transistor 200 can be disposed on the inter-layer insulation film 206, and can be spaced apart from each other.

Alternatively, in embodiments of the disclosure, the element marked with the reference number "207" can be the drain electrode, and the element marked with the reference number "208" can be the source electrode.

The source electrode 207 and the drain electrode 208 can include any one of metals such as aluminum (Al), gold (Au), silver (Ag), copper (Cu), tungsten (W), molybdenum (Mo), chromium (Cr), tantalum (Ta), and titanium (Ti) or alloys thereof, but the disclosure is not limited thereto.

Each of the source electrode 207 and the drain electrode 208 can be connected to the portion of the upper surface of the active layer 203 through a contact hole provided in the inter-layer insulation film 206.

A planarization layer 209 can be disposed on the substrate 201 on which the source electrode 207 and the drain electrode 208 are disposed. A protective film including the inorganic insulating material can be further disposed beneath the planarization layer 209.

The first electrode 211 of the organic light emitting element 210 can be disposed on a portion of an upper surface of the planarization layer 209.

The first electrode 211 can be electrically connected to the drain electrode 208 of the thin film transistor 200 through a contact hole 209a provided in the planarization layer 209. FIG. 2 illustrates a structure in which the first electrode 211 is connected to the drain electrode 208 of the thin film transistor 200, but embodiments of the disclosure are not limited thereto. For example, the first electrode 211 can be connected to the source electrode 207 of the thin film transistor 200.

FIG. 2 illustrates a structure in which the first electrode 211 is a single layer, but embodiments of the disclosure are not limited thereto. For example, the first electrode 211 can have a multi-layer structure of two or more layers.

The first electrode 211 can include a reflective electrode.

Specifically, when the first electrode 211 has a single-layer structure, it can be the reflective electrode including a reflective conductive material.

When the first electrode 211 has a multi-layer structure, at least one layer can be the reflective electrode including the reflective conductive material. The other layers than the reflective electrode can be layers formed of a transparent conductive material.

A protective pattern 250 can be disposed on a portion of an upper surface of the first electrode 211 and the portion of the upper surface of the planarization layer 209.

Referring to FIG. 2, the protective pattern 250 can be disposed to surround the portion of the upper surface and an entire side surface of the first electrode 211.

The protective pattern 250 can include an organic insulating material. The protective pattern 250 can be made of a transparent material, but embodiments of the disclosure are not limited thereto.

A bank 260 can be disposed on the protective pattern 250, a portion of the first electrode 211, and a portion of the planarization layer 209.

As illustrated in FIG. 2, the bank 260 can be disposed to surround an upper surface and a side surface of the protective pattern 250. For example, the entire protective pattern 250 can overlap a portion of the bank 260.

In other words, the protective pattern 250 can be disposed only in an area in which the bank 260 is disposed, and the first electrode 211, the protective pattern 250, and the bank 260 are stacked in this order in a portion of an area in which the protective pattern 250 is disposed.

The bank 260 can include a colored organic insulating material.

The protective patter 250 and the bank 260 can be disposed to expose the portion of the upper surface of the first electrode 211.

The bank 260 can define an emission area EA and a non-emission area NEA in the active area AA of the organic light emitting display device 100. For example, in the active area AA, the area in which the bank 220 is disposed can be the non-emission area NEA, and an area in which the bank 220 is not disposed can be the emission area EA.

The light emitting layer 212 of the organic light emitting element 210 can be disposed on the first electrode 211 and the bank 260.

FIG. 2 illustrates a structure in which the light emitting layer 212 is a single layer, but the embodiment of the disclosure is not limited thereto. For example, the light emitting layer 212 can have a multi-layer structure of two or more layers.

In addition, the light emitting layer 212 can be disposed only on the upper surface of the first electrode 211 not overlapping the bank 260.

The light emitting layer 212 can emit light of at least one of red (R), green (G), and blue (B), but the disclosure is not limited thereto. For example, the light emitting layer 212 can emit other colors of light such as white (W).

A second electrode 213 of the organic light emitting element 210 can be disposed on the substrate 201 on which the light emitting layer 212 is disposed. The second electrode 213 can include a transparent conductive material or a semi-transmissive material.

FIG. 2 illustrates a structure in which the second electrode 213 is a single layer, but the disclosure is not limited thereto. For example, the second electrode 213 can have a multi-layer structure of two or more layers.

The protective pattern 250 can serve to prevent damage to the upper surface of the first electrode 211 when the bank 260 is formed.

Hereinafter, this will be reviewed with reference to FIGS. 3 to 10.

Figure 8:
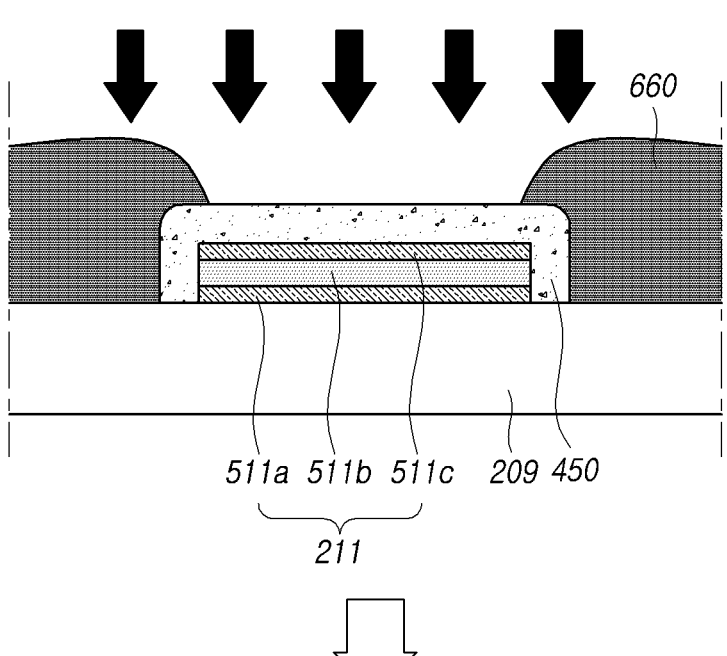
Figure 8:
Figure 8:
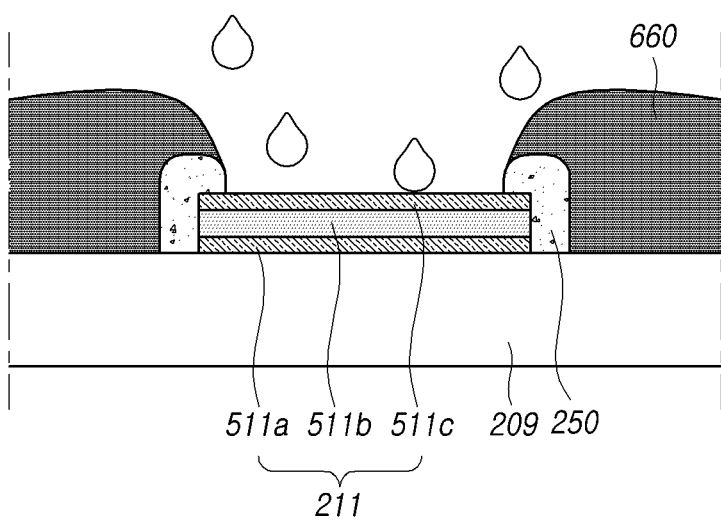
Figure 9:
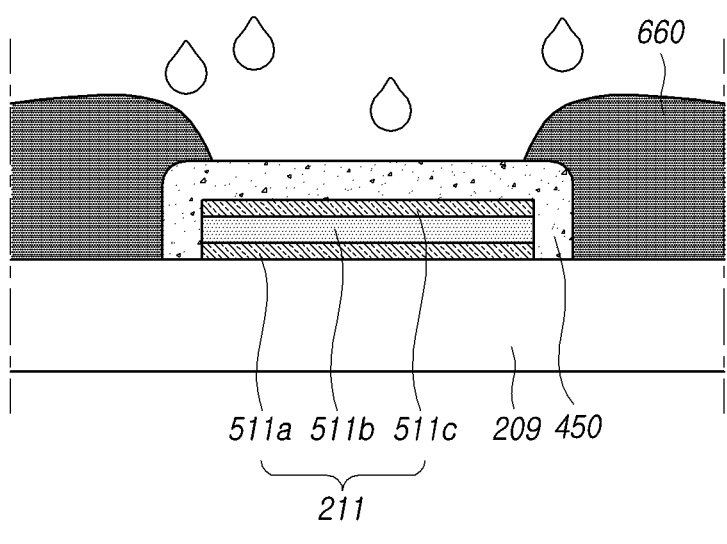
Figure 9:
Figure 9:
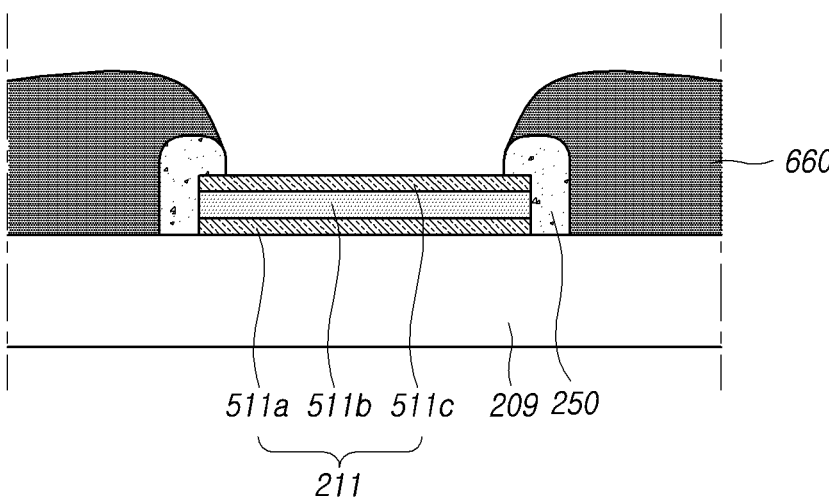
Figure 10:
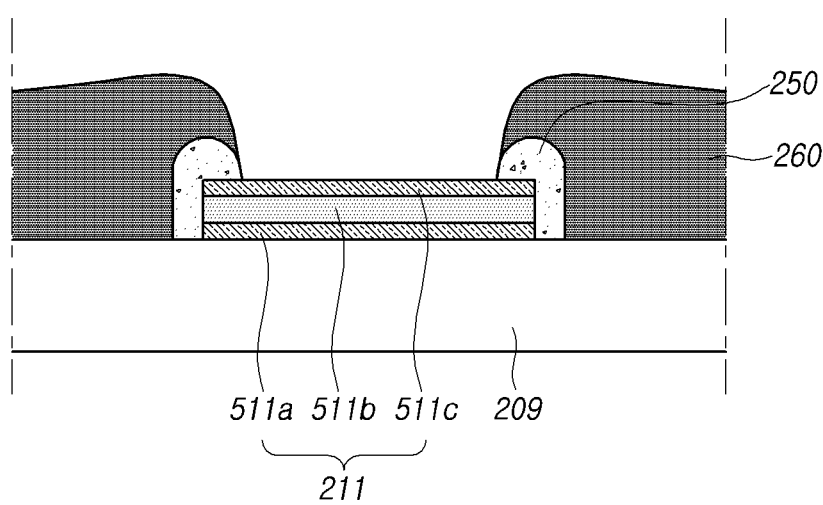

FIGS. 3 to 9 are schematic views of the process of forming the first electrode, the protective pattern, and the bank of the organic light emitting display device of FIG. 2, and FIG. 10 is a schematic view of the structure of the first electrode, the protective pattern, and the bank of the organic light emitting display device formed through the process in FIGS. 3 to 9. FIGS. 3 to 10 illustrate the structure of the first electrode, the protection pattern, and the bank of the organic light emitting diode display 100 of FIG. 2, and may not show all elements such as the substrate 201 and the thin film transistor 200 for convenience of explanation.

Figure 3:
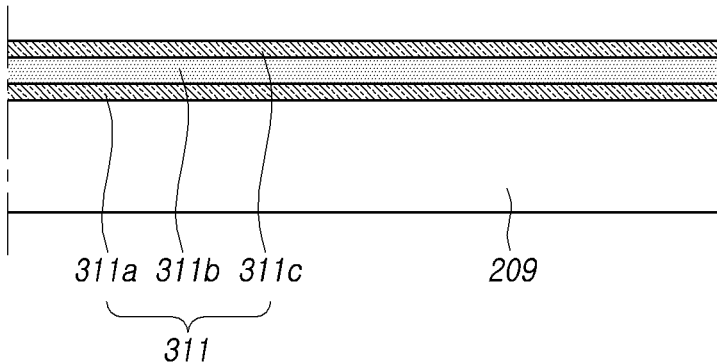
FIGS. 3 to 10 are schematic views of the process of forming a first electrode, a protective pattern, and a bank of an organic light emitting element.

First, referring to FIG. 3, a first electrode material 311 of the organic light emitting element can be formed on the planarization layer 209.

The first electrode material 311 of the organic light emitting element can include a first layer material 311*a* disposed on the planarization layer 209, a second layer material 311*b* disposed on the first layer material 311*a*, and a third layer material 311*c* disposed on the second layer material 311*b*.

Figure 4:
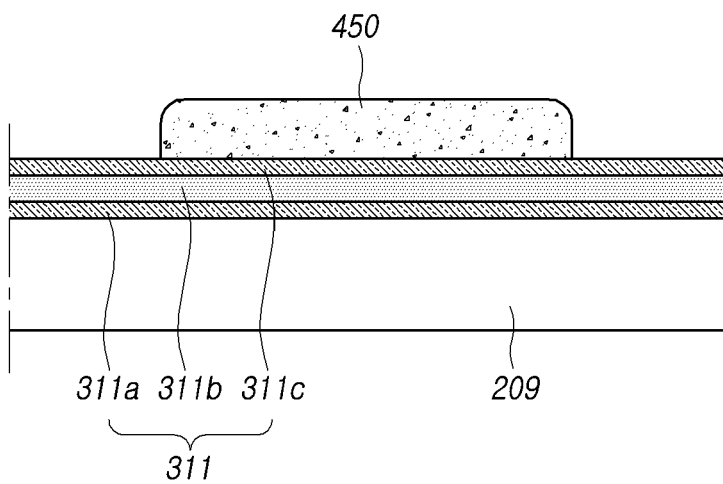

Thereafter, as illustrated in FIG. 4, a protective pattern material 450 can be formed on a portion of an upper surface of the third layer material 311*c*.

The protective pattern material 450 can be a transparent organic insulating material, but embodiments of the disclosure are not limited thereto. For example, the protective pattern material 450 can be the colored organic insulating material.

The first electrode material 311 can be patterned using the protective pattern material 450 as a mask.

The first electrode material 311 disposed in an area overlapping the protective pattern material 450 can remain on the planarization layer 209, and the first electrode material 311 disposed in an area not overlapping the protective pattern material 450 can be removed.

Figure 5:
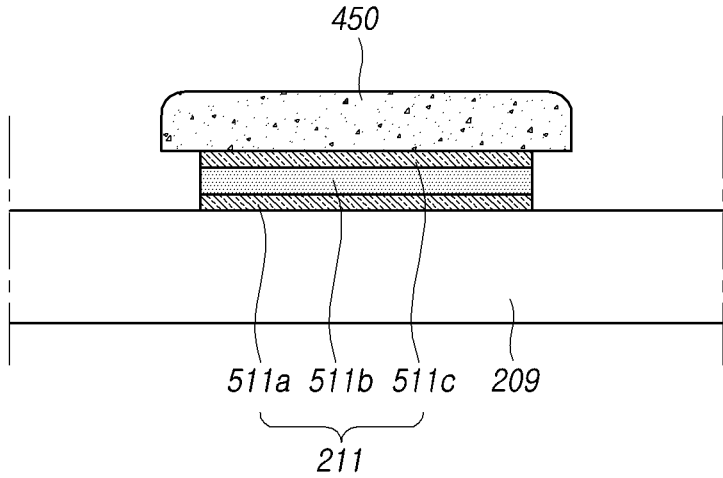
Figure 5:
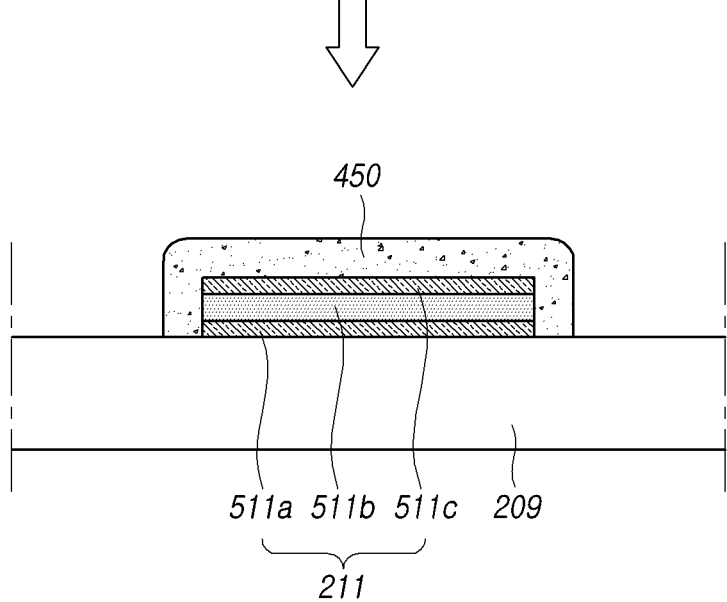

As illustrated in FIG. 5, the patterned first electrode material 311 can become the first electrode 211 disposed on the portion of the upper surface of the planarization layer 209.

The first electrode 211 can include a first layer 511*a*, a second layer 511*b* disposed on the first layer 511*a*, and a third layer 511*c* disposed on the second layer 511*b*.

Here, the first layer 511*a* and the third layer 511*c* can include the transparent conductive material. For example, the first layer 511*a* and the third layer 511*c* can include any one of Indium Tin Oxide (ITO), Indium Zinc Oxide (IZO), and Indium Gallium Zinc Oxide (IGZO), but embodiments of the disclosure are not limited thereto.

The second layer 511*b* can include the reflective conductive material. For example, the second layer 511*b* can include any one of metals such as aluminum (Al), gold (Au), silver (Ag), copper (Cu), tungsten (W), molybdenum (Mo), chromium (Cr), tantalum (Ta), and titanium (Ti) or alloys thereof, but embodiments of the disclosure are not limited thereto.

Thereafter, through a curing process, the protective pattern material 450 can have fluidity.

Accordingly, as illustrated in FIG. 5, the protective pattern material 450 disposed only on an upper surface of the third layer 511*c* of the first electrode 211 can be disposed to flow down to the side surface of the first electrode 211 due to the fluidity for surrounding the upper and side surfaces of the first electrode 211.

Thereafter, the protective pattern material 450 can be cured.

The cured protective pattern material 450 can surround the upper side and a side surface of the third layer 511*c*, a side surface of the second layer 511*b*, and a side surface of the first layer 511*a* of the first electrode 211.

A bank material can be formed on the planarization layer 209 on which the protective pattern material 450 is formed.

The bank material can be formed and patterned on the entire substrate.

Figure 6:
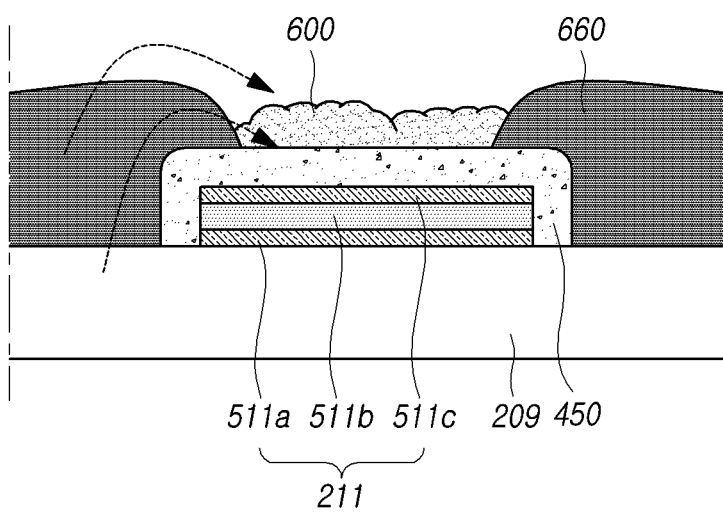

Accordingly, as illustrated in FIG. 6, a bank pattern 660 formed by patterning the bank material can be disposed to surround a portion of an upper surface and a side surface of the protective pattern material 450 disposed on the planarization layer 209.

In addition, the bank pattern 660 can be disposed to overlap ends of the first electrode 211 and expose the portion of the upper surface of the first electrode 211.

Meanwhile, a foreign substance 600 due to the bank pattern 660 can be generated in the process of patterning the bank material.

The foreign substance 600 can be formed on a portion of the surface of the protective pattern material 450. For example, as illustrated in FIG. 6, the foreign substance 600 can be formed on an upper surface of the protective pattern material 450 that does not overlap the bank pattern 660.

Thereafter, a portion of the protective pattern material 450 can be removed to remove the foreign substance 600 overlapping the first electrode 211.

Figure 7:
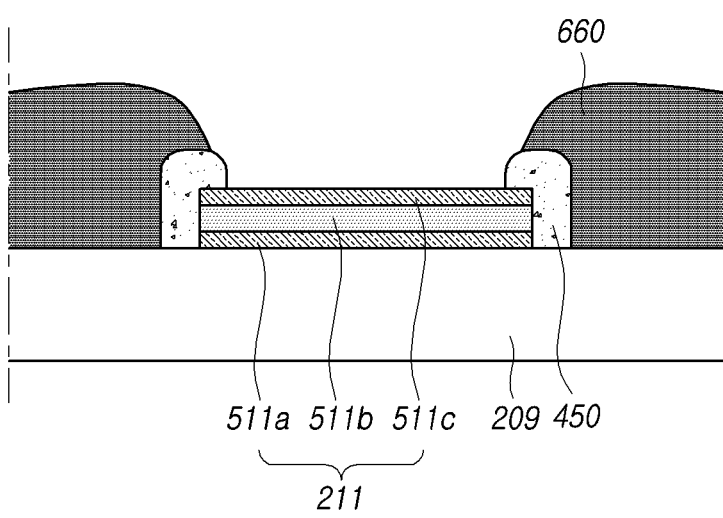

For example, as illustrated in FIG. 7, the protective pattern material 450 overlapping the portion of the upper surface of the first electrode 211 can be removed.

Accordingly, the protective pattern material 450 can overlap the ends of the first electrode 211.

The bank pattern 660 can be formed to cover a portion of the upper surface and the side surface of the protective pattern material 450.

In an area where the protective pattern material 450 overlaps the first electrode 211, the bank pattern 660 can be disposed to expose a portion of the side surface of the protective pattern material 450.

In order to remove the foreign substance 600 formed on the protective pattern material 450, the protective pattern material 450 itself disposed in an area overlapping the foreign substance 600 can be partially removed.

For example, as the protective pattern material 450 is partially removed, the foreign substance 600 provided on the protective pattern material 450 can also be removed.

The method of removing the protective pattern material 450 disposed on the first electrode 211 can be used in various ways.

For example, referring to FIG. 8, when UV light is irradiated on the substrate on which the first electrode 211, the protective pattern material 450, and the bank pattern 660 are disposed and the protective pattern material 450 disposed in an area directly irradiated with the UV light is decomposed, the protective pattern material 450 can be removed.

Specifically, the protective pattern material 450 can include a material that is decomposed when irradiated with UV light.

The bank pattern 660 can include a material that is strengthened when irradiated with UV light.

Accordingly, when UV light is irradiated on the substrate on which the first electrode 211, the protective pattern material 450, and the bank pattern 660 are disposed, the protective pattern material 450 disposed in an area overlapping the bank pattern 660 may not be decomposed, and only the protective pattern material 450 disposed in an area not overlapping the bank pattern 660 can be decomposed.

Thereafter, as illustrated in FIG. 8, the protective pattern 250 can be formed by removing the protective pattern material 450 disposed in the area not overlapping the bank pattern 660 from the first electrode 211 through a development process.

Although FIG. 8 shows the process of removing the protective pattern material 450 by irradiating UV light thereon, the process of manufacturing the organic light emitting display device according to embodiments of the disclosure is not limited thereto.

For example, referring to FIG. 9, the protective pattern material 450 can be partially removed using a stripper or an etchant.

The protective pattern material 450 can include a material that is decomposed by the stripper.

In contrast, the bank pattern 660 can include a material having chemical resistance in the stripper.

Accordingly, when, in a state where the first electrode 211, the protective pattern material 450, and the bank pattern 660 are disposed, the stripper is used so that the protective pattern material 450 exposed to the stripper is decomposed, the protective pattern material 450 can be removed.

For example, the protective pattern material 450 disposed in the area overlapping the bank pattern 660 may not be decomposed, and only the protective pattern material 450 disposed in the area not overlapping the bank pattern 660 can be decomposed.

Thereafter, through a rinse process, the protective pattern material 450 disposed in the area not overlapping the bank pattern 660 can be removed from the upper surface of the first electrode 211.

In this case, since the stripper and the material used in the rinse process react only with organic materials, they may not affect the surface of the first electrode 211.

The process of removing the protective pattern material 450 disposed in the area overlapping the foreign substance 600 is not limited thereto, and both of the methods illustrated in FIGS. 8 and 9 can be applied. Furthermore, through a plasma process, the foreign substance 600 and the protective pattern material 450 disposed in the area overlapping the foreign substance 600 can be removed.

As illustrated in FIGS. 8 and 9, the protective pattern material 450 disposed on the first electrode 211 can be partially removed, thereby forming the protective pattern material 450 for exposing the portion of the upper surface of the first electrode 211.

Thereafter, in a state where the portion of the protective pattern material 450 is removed, a bake process can be performed.

The bake process can be a process of curing the protective pattern material 450 and the bank pattern 660 by applying heat at a specific temperature.

In this process, the material of the bank pattern 660 can have fluidity and, therefore, can be formed to cover the entire upper surface and the entire side surface of the protective pattern material 450.

Accordingly, as illustrated in FIG. 10, the protective pattern 250 and the bank 260 can be disposed to expose the portion of the upper surface of the first electrode 211, and, here, the bank 260 can overlap the entire upper surface and the entire side surface of the protective pattern 250.

The protective pattern 250 can be disposed to be in contact with the portion of the upper surface and the entire side surface of the first electrode 211 and in contact with the portion of the upper surface of the planarization layer 209.

In the meantime, in the process of forming the bank 260, when the protective pattern material 450 surrounding the first electrode 211 does not exist, the foreign substance 600 can be disposed on the upper surface of the first electrode 211.

In order to minimize contamination of the first electrode 211, the surface of the first electrode 211 can be plasma-treated.

However, when an unnecessary structure such as a pin hole is present on the first electrode 211, foreign substances can get in the pin hole. In this case, even if the surface of the first electrode 211 is plasma-treated, the foreign substances can remain on the first electrode 211.

In addition, since the upper surface of the first electrode 211 can be exposed directly to plasma, the surface of the first electrode 211 can be damaged depending on process conditions.

Such foreign substances can be adsorbed to the first electrode 211 in the process of baking the bank 260, thereby causing defects in the sub-pixels.

In the organic light emitting display device 100 according to embodiments of the disclosure, the protective pattern material 450 can surround the entire upper surface and the entire side surface of the first electrode 211 in the process of forming the bank 260, and the protective pattern material 450 in an area not overlapping the bank 260 can be removed together with the foreign substance 600 after the formation of the bank 260.

For example, the foreign substance 600 generated in the process of forming the bank 260 can be present not on the upper surface of the first electrode 211 but on the protective pattern material 450, and the protective pattern material 450 itself on which the foreign substance 600 is present can be removed. As a result, even when the pin hole is present on the surface of the first electrode 211, the foreign substance 600 may not remain on the first electrode 211.

Therefore, the possibility of defects in the sub-pixels due to the foreign substance 600 generated in the process of forming the bank 260 can be removed or reduced.

The bank 260 according to embodiments of the disclosure can have a different height for each area on which it is disposed, and a slope of a side surface of the bank 260 can be adjusted due to the protective pattern 250. Hereinafter, this will be reviewed with reference to FIG. 11.

Figure 11:
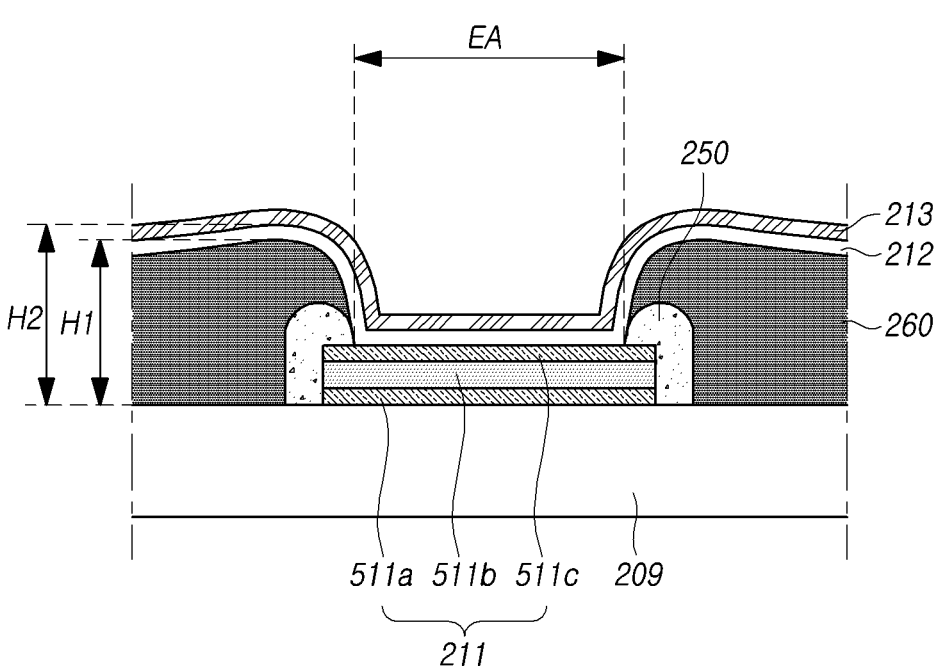
FIG. 11 is a view illustrating an arrangement relationship of the first electrode, the protective pattern, and the bank according to embodiments of the disclosure.

FIG. 11 is a view illustrating an arrangement relationship of the first electrode, the protective pattern, and the bank according to embodiments of the disclosure.

In the following description, what has already been described in the above-mentioned embodiments (e.g., configurations, effects, etc.) can be omitted. In addition, in the following description, a drawing reference number of a configuration that has already been described in the above-mentioned embodiments can be the same as the reference number used above.

Referring to FIG. 11, a height from the upper surface of the planarization layer 209 to an upper surface of the bank 260 can be adjusted through the protective pattern 250.

Specifically, the height H1 from the upper surface of the planarization layer 209 to the upper surface of the bank 260 in an area where a lower portion of the bank 260 is in contact with the planarization layer 209 can be lower than a height H2 from the upper surface of the planarization layer 209 to the upper surface of the bank 260 in an area where the bank 260 overlaps the protective pattern 250.

As the height of the protective pattern 250 increases, the height H2 from the upper surface of the planarization layer 209 to the upper surface of the bank 260 can increase.

As the height of the protective pattern 250 increases, the slope of the side surface of the bank 260 can increase.

An angle between the side surface and a horizontal surface of the bank 260 can be 60° to 70°.

The angle between the side surface and the horizontal surface of the bank 260 can be a factor in determining the efficiency of light emitted from the emission area EA.

Specifically, the angle between the side surface and the horizontal surface of the bank 260 can determine a thickness of the light emitting layer 212 disposed on the bank 260 and the first electrode 211 or a thickness disposed in an area corresponding to the side surface of the bank 260.

For example, in the case of forming the light emitting layer 212 by deposition, the thickness of the light emitting layer 212 deposited in a direction corresponding to a direction where the first electrode 211 is stacked on the planarization layer 209 can be constant.

Due to the properties of a deposition process, the thickness of the light emitting layer 212 that actually drives current between the first electrode 211 and the second electrode 213 at the position where a slope of the light emitting layer 212 or a slope with respect to the surface of the planarization film 209 is the largest can be thinner than that of the light emitting layer 212 disposed on the upper surface of the first electrode 211.

At the position where the slope of the light emitting layer 212 is the smallest, the thickness of the light emitting layer 212 can be thicker than that of the light emitting layer 212 disposed on the upper surface of the first electrode 211.

In this case, current can be concentrated to the position where the thickness of the light emitting layer 212 is the thinnest.

Therefore, the thickness of the light emitting layer 212 can be important in the side surface of the bank 260 where the slope of the light emitting layer 212 is generated.

As described above, the angle between the side surface and the horizontal surface of the bank 260 can affect the thickness of the light emitting layer 212.

However, it can be difficult to finely adjust the angle between the side surface and the horizontal surface of the bank 260 only through the process of forming the bank 260.

In contrast, in the organic light emitting display device 100 according to embodiments of the disclosure, since the protective pattern 250 can be disposed beneath the bank 260, the slope of the side surface of the bank 260 can be adjusted.

In other words, the angle between the side surface and the horizontal surface of the bank 260 may not be determined only by the fluidity (adding fluidity by controlling temperature) of an organic material necessary to form the bank 260, and the slope of the side surface of the bank 260 can be adjusted by applying the protective pattern 250 overlapping the portion of the first electrode 211 and the portion of the bank 260 in addition to the fluidity of the organic material necessary to form the bank 260.

In addition, the protective pattern 250 can include the organic insulating material so that the height of the protective pattern 250 itself can be easily adjusted.

For example, when the protective pattern 250 is formed of the inorganic insulating material or a metallic material, there can be a limitation in adjusting the height of the protective pattern 250 due to the properties of the materials.

In particular, when the height of the protective pattern 250 is low, the height from the upper surface of the planarization layer 209 to the upper surface of the bank 260 can be lowered in the area where the protective pattern 250 is disposed. As a result, the slope of the side surface and the horizontal surface of the bank 260 can be lowered, so the thickness of the light emitting layer 212 in the area corresponding to the side surface of the bank 260 and the thickness of the light emitting layer 212 disposed on the upper surface of the first electrode 211 can be different from each other.

The height of the protective pattern 250 according to embodiments of the disclosure can be higher than that of the first electrode 211, and can be equal to or lower than that of the bank 260 in an area where the bank 260 does not overlap the protective pattern 250. Here, the height of the protective pattern 250 can be the shortest length from a lower surface to an upper surface of the protective pattern 250 in an area where the protective pattern 250 does not overlap the first electrode 211.

For example, since the height of the protective pattern 250 can be low, it can be easy to adjust the slope of the side surface of the bank 260 overlapping the first electrode 211. Furthermore, since the height of the protective pattern 250 can be lower than that of the bank 260 and, therefore, the protective pattern 250 can be surrounded by the bank 260, it can be possible to prevent light leakage between the sub-pixels through the protective pattern 250.

In addition, the light emitting layers 212 of the same thickness can be disposed even in the area corresponding to the side surface of the bank 260 of the organic light emitting display device 100 according to embodiments of the disclosure so that current can be prevented from being concentrated to a portion of the organic light emitting element.

When the protective pattern 250 is formed of the metallic material, in order to avoid damage to the first electrode 211, the material of the protective pattern can be etched with an etchant in which the first electrode 211 is not etched or the material of the protective pattern can be etched through a mask process. As a result, the process can be complicated and the surface of the first electrode 211 can be damaged.

In addition, when the protective pattern 250 is formed of the inorganic insulating material, the material can be patterned through a dry etching process. As a result, the process can be complicated and the surface of the first electrode 211 can be damaged due to the dry etching process.

Furthermore, since the metallic materials and the inorganic insulating materials do not have much fluidity even when they are heated, it can be difficult to adjust the shape through temperature.

Particularly, when the protective pattern 250 is formed of the metallic material and the inorganic insulating material, the protective pattern 250 can be formed along morphology of a configuration disposed therebeneath. Therefore, in the case that the protective pattern 250 is formed even on the portion of the upper surface and the side surface of the first electrode 211, the material of the protective pattern 250 may not be properly formed due to the step difference due to the end of the first electrode 211.

In addition, the metallic materials and the inorganic insulating materials have crystallinity. Accordingly, when the material of the protective pattern 250 is formed by the deposition process, the pin holes can be generated. Thus, when the metallic material or the inorganic insulating material is continuously deposited for the formation of its sufficient thickness, it can be difficult to form the protective pattern 250 at a desired position and of a desired thickness due to defects such as the pin holes.

Contrastively, since the protective pattern 250 according to embodiments of the disclosure can be formed of the organic insulating material, the patterning process can be simplified, and the shape and position of the protective pattern 250 can be freely adjusted by applying heat. In particular, it can be possible to form the protective pattern 250 even on the side surface of the first electrode.

Meanwhile, FIGS. 3 to 11 illustrate a structure where at least one side surface of the protective pattern 250 has a normal tapered shape, but the shape of the protective pattern 250 is not limited thereto.

FIGS. 12 to 17 are views of various shapes of the protective pattern.

In the following description, what has already been described in the above-mentioned embodiments (e.g., configurations, effects, etc.) can be omitted. In addition, in the following description, a drawing reference number of a configuration that has already been described in the above-mentioned embodiments can be the same as the reference number used above.

Figure 12:
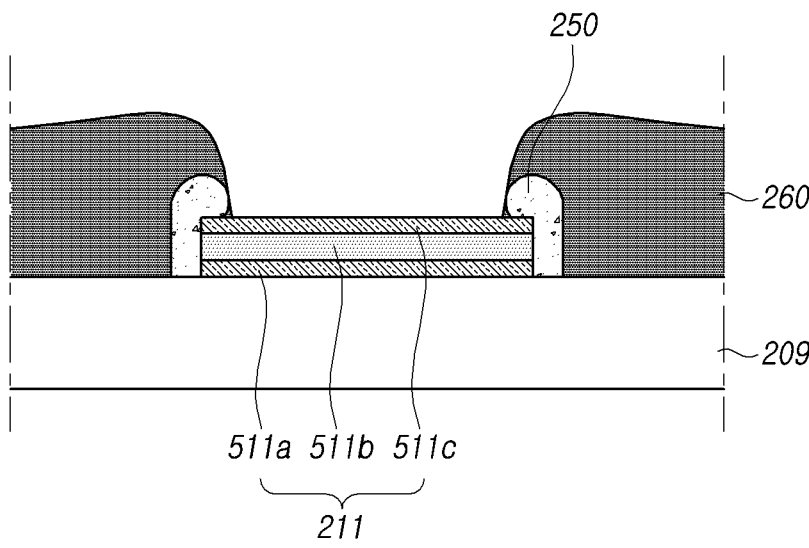
FIGS. 12 to 17 are views of various shapes of the protective pattern.

Referring to FIG. 12, at least one side surface of the protective pattern 250 according to embodiments of the disclosure can have a reverse tapered shape.

For example, as in the protective pattern 250 of FIG. 2, when the bake process is performed at a higher temperature than that for a shape not including a reverse tapered side surface, at least one side surface of the protective pattern 250 can have the reverse tapered shape.

As illustrated in FIG. 12, one side surface of the protective pattern 250 disposed in an area overlapping the first electrode 211 can have the reverse tapered shape, but embodiments of the disclosure are not limited thereto. For example, the other side surface of the protective pattern 250 can have the reverse tapered shape, or the both side surfaces of the protective pattern 250 can have the reverse tapered shape.

Figure 13:
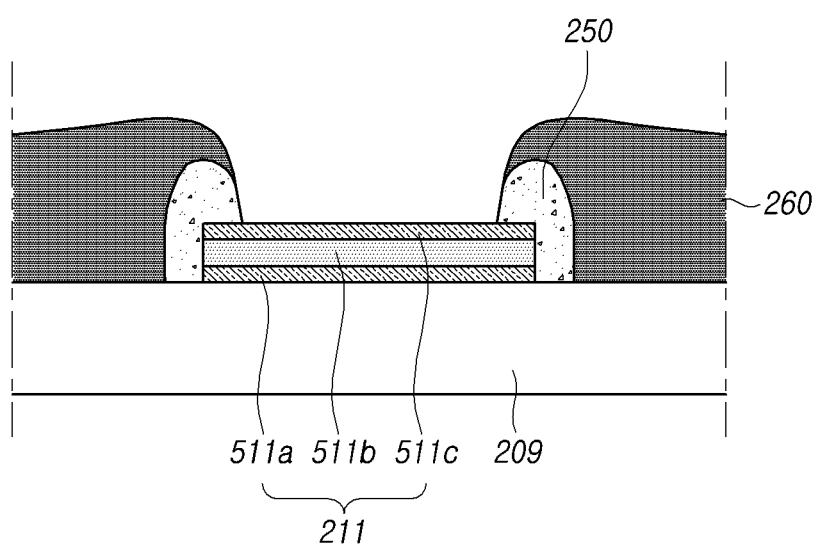

Referring to FIG. 13, the slope of the side surface overlapping the first electrode 211 among the side surfaces of the protective pattern 250 according to embodiments of the disclosure can be greater than the slope of the side surface not overlapping the first electrode 211 among the side surfaces of the protective pattern 250.

For example, in the case of forming the protective pattern 250 through UV light in the process of forming the protective pattern 250, when the exposure amount is lower than that in the process of forming the protective pattern 250 of FIG. 2, the shape of the finally formed protective pattern 250 can correspond to that of FIG. 13.

In addition, as the exposure amount reaching the material of the protective pattern 250 increases, the protective pattern 250 having a lower height than the protective pattern 250 of FIG. 2 can be formed.

Figure 14:
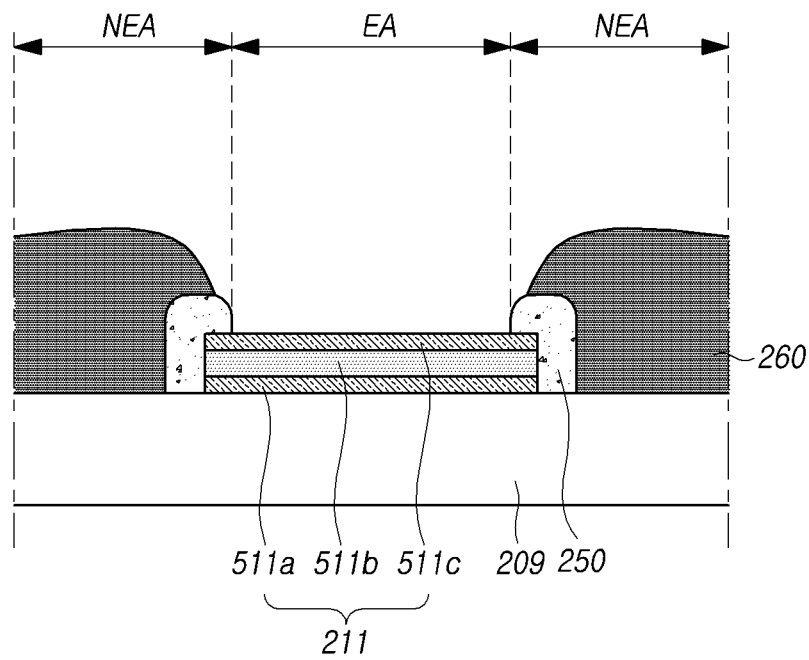

Referring to FIG. 14, the bank 260 can be disposed to expose a portion of the surface of a protective pattern 250.

For example, the bank 260 can be disposed to expose the portion of the side surface of the protective pattern 250 or to expose the portion of the side surface and a portion of the upper surface of the protective pattern 250 in an area where the protective pattern 250 overlaps the first electrode 211.

When the baking temperature is low or the processing time is short in the process of forming the bank 260, its material may not have sufficient fluidity. As a result, the bank 260 may not be formed for its material to surround the entire surface of the protective pattern 250. The bank 260 can be formed to expose the portion of the surface of the protective pattern 250 in the area where the protective pattern 250 overlaps the first electrode 211.

Figure 15:
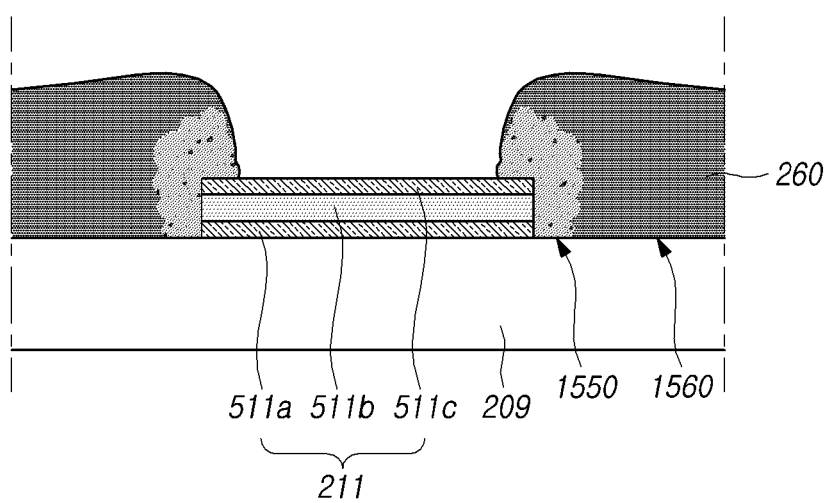

Referring to FIG. 15, there can be a mixed area 1550 of the protective pattern and the bank where some of the material of the protective pattern 250 is mixed with some of the material of the bank 260 as mentioned above.

The mixed area 1550 of the protective pattern and the bank can be in contact with the portion of the upper surface and the entire side surface of the first electrode 211.

The bank 260 can be disposed to be in contact with the upper surface of the planarization layer 209 and surround an entire upper surface and an entire side surface of the mixed area 1550 thereof.

For example, as illustrated in FIG. 15, the material of the protective pattern and the material of the bank can be mixed in the process of forming the protective pattern and the bank.

Accordingly, the mixed area 1550 of the protective pattern and the bank, in which the material of the protective pattern is mixed with the material of the bank, and a bank area 1560 where only the bank 260 exists can be generated.

A boundary line can exist between the bank area 1560 and the mixed area 1550 of the protective pattern and the bank.

The height from the upper surface of the planarization layer 209 to the upper surface of the bank 260 in the bank area 1560 can be lower than the height from the upper surface of the planarization layer 209 to the upper surface of the bank 260 in the mixed area 1550 of the protective pattern and the bank.

Even if the mixed area 1550 where the material of the protective pattern is mixed with the material of the bank overlaps the portion of the first electrode 211 in the area where the bank 260 is disposed, the surface of the first electrode 211 can be prevented from being contaminated by the foreign substances, and the slope of the side surface of the bank 260 overlapping the first electrode 211 can be easily adjusted.

Figure 16:
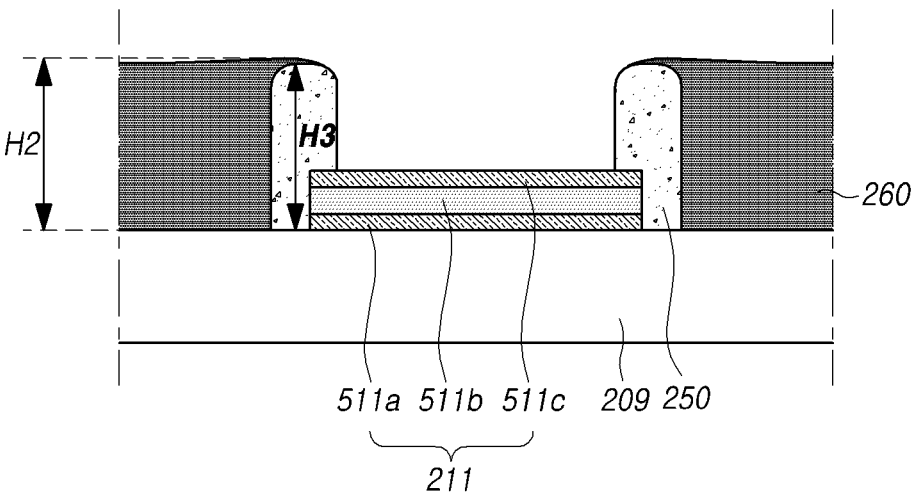

Referring to FIG. 16, the height H2 from the upper surface of the planarization layer 209 to the upper surface of the bank 260 in the area where the bank 260 overlaps the protective pattern 250 can be substantially equal to a height H3 from the upper surface of the planarization layer 209 to the upper surface of the protective pattern 250 in the area where the protective pattern 250 does not overlap the first electrode 211.

The bank 260 can expose the portion of the side surface of the protective pattern 250 and, in some cases, can expose even the portion of the upper surface of the protective pattern 250, but the structure of the bank 260 according to embodiments of the disclosure are not limited thereto. For example, the bank 260 can be capable of surrounding both the side surface and the upper surface of the protective pattern 250.

The angle between the side surface and the horizontal surface of the bank 260 overlapping the first electrode 211 of FIG. 16 can be greater than the angle between the side surface and the horizontal surface of the bank 260 overlapping the first electrode 211 of FIG. 2 and FIGS. 12 to 15.

In the meantime, in the description above, the structure where the protective pattern 250 surrounds the side surface of the first electrode 211 has been mainly described, but the structure of the protective pattern 250 according to embodiments of the disclosure is not limited thereto.

Figure 17:
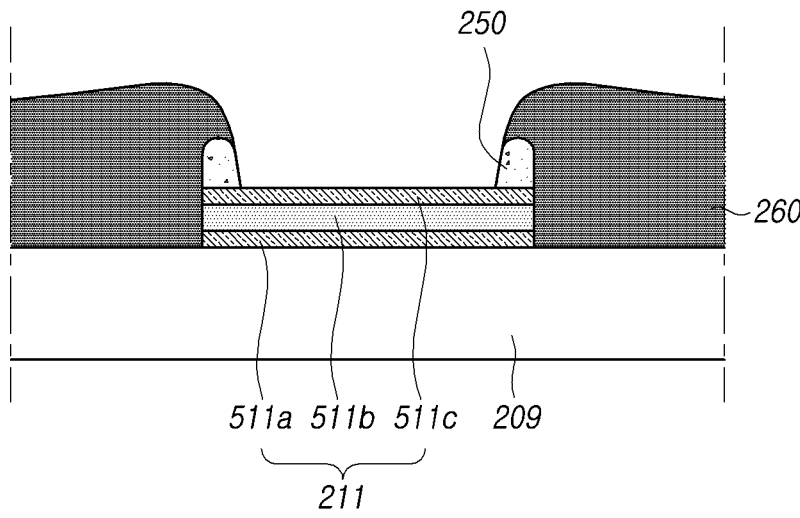

For example, as illustrated in FIG. 17, the protective pattern 250 can be disposed only on the upper surface of the first electrode 211 in an area where the protective pattern 250 overlaps the bank 260.

Figure 18:
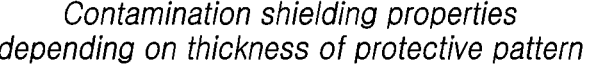
FIG. 18 shows a graph for illustrating contamination shielding properties and outgassing properties depending on the thickness of a protective pattern of FIG. 2.
Figure 18:
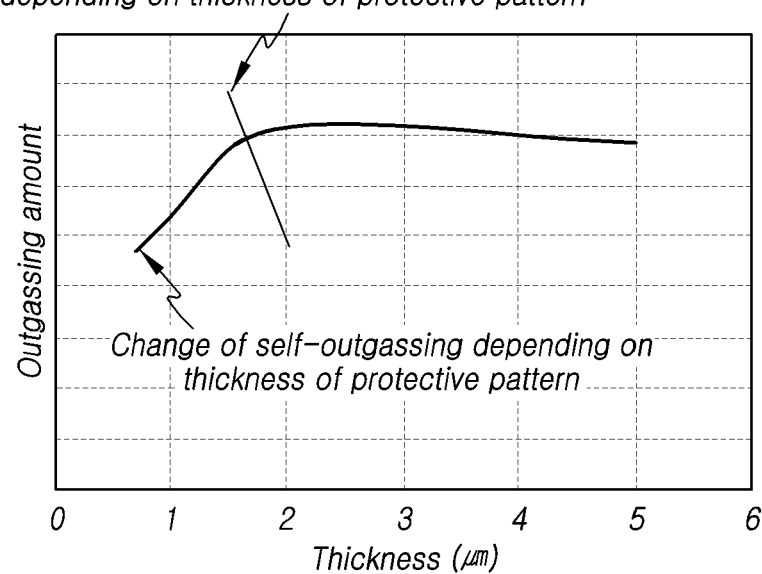

FIG. 18 is a graph showing contamination shielding properties and outgassing properties depending on the thickness of the protective pattern in the structure of FIG. 2.

Referring to FIG. 18, when the protective pattern 250 is patterned in the process of forming the protective pattern 250 of the organic light emitting display device 100 according to embodiments of the disclosure, the outgassing amount can increase when the thickness of the protective pattern is in the range of 700 nm to 1.8 µm, and gas can be emitted at a similar level when the thickness is more than 1.8 µm.

As the thickness of the protective pattern 250 decreases, the contamination shielding properties of the first electrode 211 can deteriorate.

Therefore, the thickness of the protective pattern 250 can be 700 nm to 1.8 µm in order to maintain both the outgassing properties and the contamination shielding properties at an appropriate level.

According to embodiments of the disclosure, there can be provided the organic light emitting display panel having improved reliability without the foreign substances existing on the electrodes of the organic light emitting element and the organic light emitting display device.

According to embodiments of the disclosure, there can be provided the organic light emitting display panel having the organic light emitting element where the angle between the side surface and the horizontal surface of the bank is easily adjusted to make the thickness of the organic layer constant, thereby improving luminous efficiency, and the organic light emitting display device.

The description above has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the disclosure. The description above and the accompanying drawings provide an example of the technical idea of the disclosure for illustrative purposes only. For example, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device, comprising:
a planarization layer disposed on a substrate;
a first electrode disposed on a portion of an upper surface of the planarization layer;

a protective pattern disposed on a portion of an upper surface of the first electrode;
a bank disposed to expose the portion of the upper surface of the first electrode, and to be in contact with the portion of the upper surface of the planarization layer while surrounding the protective pattern;
a light emitting layer disposed on the bank and disposed on the upper surface of the first electrode that does not overlap the bank; and
a second electrode disposed on the light emitting layer,
wherein a height from the upper surface of the planarization layer to an upper surface of the bank in an area where a lower portion of the bank is in contact with the planarization layer is lower than a height from the upper surface of the planarization layer to an upper surface of the bank in an area where the bank overlaps the protective pattern.

2. The organic light emitting display device of claim 1, wherein the bank comprises a colored organic insulating material.

3. The organic light emitting display device of claim 1, wherein the protective pattern surrounds a side surface of the first electrode.

4. The organic light emitting display device of claim 1, wherein a height from the upper surface of the planarization layer to an upper surface of the bank in an area where the bank overlaps the protective pattern is proportional to a height of the protective pattern.

5. The organic light emitting display device of claim 1, wherein a slope of a side surface of the bank in an area where the bank overlaps the protective pattern increases as a height of the protective pattern increases.

6. The organic light emitting display device of claim 1, wherein at least a portion of a side surface of the protective pattern has a reverse tapered shape.

7. The organic light emitting display device of claim 6, wherein the side surface of the protective pattern in an area in which the protective pattern overlaps the first electrode has a reverse tapered shape.

8. The organic light emitting display device of claim 1, wherein a slope of a side surface of the protective pattern in an area overlapping the first electrode is greater than a slope of a side surface of the protective pattern in an area in which the protective pattern is not overlapped with the first electrode.

9. The organic light emitting display device of claim 1, wherein the bank is disposed to expose at least a portion of a side surface of the protective pattern in an area in which the protective pattern overlaps the first electrode.

10. The organic light emitting display device of claim 1, wherein a mixed area is provided in which a material of the protective pattern and a material of the bank are mixed, and the mixed area in which the protective pattern and the bank overlap the first electrode.

11. The organic light emitting display device of claim 10, wherein the bank surrounds the mixed area, and a boundary is formed between the mixed area and a bank area in which the bank is located.

12. The organic light emitting display device of claim 1, wherein the protective pattern is disposed in a non-emission area.

13. The organic light emitting display device of claim 1, wherein a height of the protective pattern is greater than a height of the first electrode, and is equal to or lower than a height of the bank in an area where the bank does not overlap the protective pattern.

14. The organic light emitting display device of claim 13, wherein the protective pattern has a thickness of about 700 nm to about 1.8 μm.

15. An organic light emitting display panel, comprising:

a substrate comprising an emission area and a non-emission area adjacent to the emission area;

a planarization layer disposed on the substrate;

a first electrode disposed on a portion of an upper surface of the planarization layer;

a protective pattern surrounding a portion of an upper surface and a side surface of the first electrode, and disposed in the non-emission area;

a bank disposed to expose the portion of the upper surface of the first electrode, and to be in contact with the portion of the upper surface of the planarization layer while surrounding the protective pattern;

a light emitting layer disposed on the bank and disposed on the upper surface of the first electrode that does not overlap the bank; and a second electrode disposed on the light emitting layer, wherein a slope of a side surface of the bank in an area where the bank overlaps the protective pattern increases as a height of the protective pattern increases.

16. The organic light emitting display panel of claim 15, wherein the protective pattern comprises a transparent organic insulating material, or the bank comprises a colored organic insulating material.

17. The organic light emitting display panel of claim 15, wherein the bank is disposed to expose at least a portion of a side surface of the protective pattern in an area overlapping the first electrode.

18. The organic light emitting display panel of claim 15, wherein the protective pattern comprises a transparent organic insulating material.

\* \* \* \* \*